(12) United States Patent
Park et al.

(10) Patent No.: US 11,367,476 B2
(45) Date of Patent: Jun. 21, 2022

(54) BIT LINE EQUALIZATION DRIVER CIRCUITS AND RELATED APPARATUSES, METHODS, AND COMPUTING SYSTEMS TO AVOID DEGRADATION OF PULL-DOWN TRANSISTORS

(71) Applicant: Micron Technology, Inc., Boise, ID (US)

(72) Inventors: Sang-Kyun Park, Boise, ID (US); Yuan He, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/988,970

(22) Filed: Aug. 10, 2020

(65) Prior Publication Data

US 2022/0044721 A1 Feb. 10, 2022

(51) Int. Cl.
| | |
|---|---|
| G11C 11/4074 | (2006.01) |
| G11C 11/4094 | (2006.01) |
| G11C 11/408 | (2006.01) |
| G11C 29/02 | (2006.01) |

(52) U.S. Cl.
CPC ...... *G11C 11/4074* (2013.01); *G11C 11/4085* (2013.01); *G11C 11/4094* (2013.01); *G11C 29/021* (2013.01); *G11C 2207/2254* (2013.01)

(58) Field of Classification Search
CPC ............ G11C 11/4074; G11C 11/4085; G11C 11/4094; G11C 29/021; G11C 2207/2254
See application file for complete search history.

(56) References Cited

U.S. PATENT DOCUMENTS

| | | | |
|---|---|---|---|
| 6,314,045 B1 * | 11/2001 | Ikeda | G11C 7/10 365/189.08 |
| 7,280,422 B2 | 10/2007 | Kim et al. | |
| 8,395,953 B2 | 3/2013 | Kim et al. | |
| 2008/0205175 A1 | 8/2008 | Park et al. | |
| 2011/0228624 A1 | 9/2011 | Kim et al. | |
| 2014/0085285 A1 * | 3/2014 | Kim | G11C 19/28 345/211 |

FOREIGN PATENT DOCUMENTS

KR 100364128 B1 * 12/2002

* cited by examiner

*Primary Examiner* — Sultana Begum
(74) *Attorney, Agent, or Firm* — TraskBritt

(57) ABSTRACT

Bit line equalization driver circuits and related apparatuses, methods, and computing systems are disclosed. An apparatus includes an output inverter including a pull-up transistor and a pull-down transistor electrically connected in series between a pull-up node and a pull-down node. An output node is electrically connected between the pull-up transistor and the pull-down transistor. The pull-down transistor includes a short length transistor having a degradation voltage potential across the pull-down transistor below which the pull-down transistor is configured to operate to avoid degradation of the pull-down transistor. The apparatus also includes biasing circuitry configured to control voltage potentials at the pull-up node and the pull-down node to enable the output inverter to assert, at the output node, an output voltage potential that is greater than the degradation voltage potential higher than a low power supply voltage potential at the low power supply node.

20 Claims, 9 Drawing Sheets

BIT LINE EQUALIZATION DRIVER CIRCUITS AND RELATED APPARATUSES, METHODS, AND COMPUTING SYSTEMS TO AVOID DEGRADATION OF PULL-DOWN TRANSISTORS

TECHNICAL FIELD

The present disclosure relates generally to biasing of driver circuits including short length transistors, and more specifically to biasing of bit line equalization driver circuits for driving bit line equalization in bit line pre-charge operations.

BACKGROUND

In some memory devices such as dynamic random access memory (DRAM) devices bit lines electrically connected to memory cells in memory cell arrays may be pre-charged prior to a read operation to read an electric charge stored by a memory cell. For example, bit lines may be pre-charged to a voltage potential between two or more logic level voltage potentials corresponding to two or more states of the memory cells (e.g., between a logic level high voltage potential corresponding to a "1" bit and a logic level low voltage potential corresponding to a "0" bit, without limitation). A bit line that is pre-charged to substantially a halfway point between logic levels may limit a voltage potential swing, during a read operation, of a bit line voltage potential to substantially half of a voltage potential range between the logic levels. This may prevent excessively long charge times associated with a transition of the bit line voltage potential across an entire range of values from one logic level to another logic level during a read operation. Also, pre-charging of bit lines may maintain the voltage potentials of bit lines within operational ranges for sense amplifiers during read operations.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
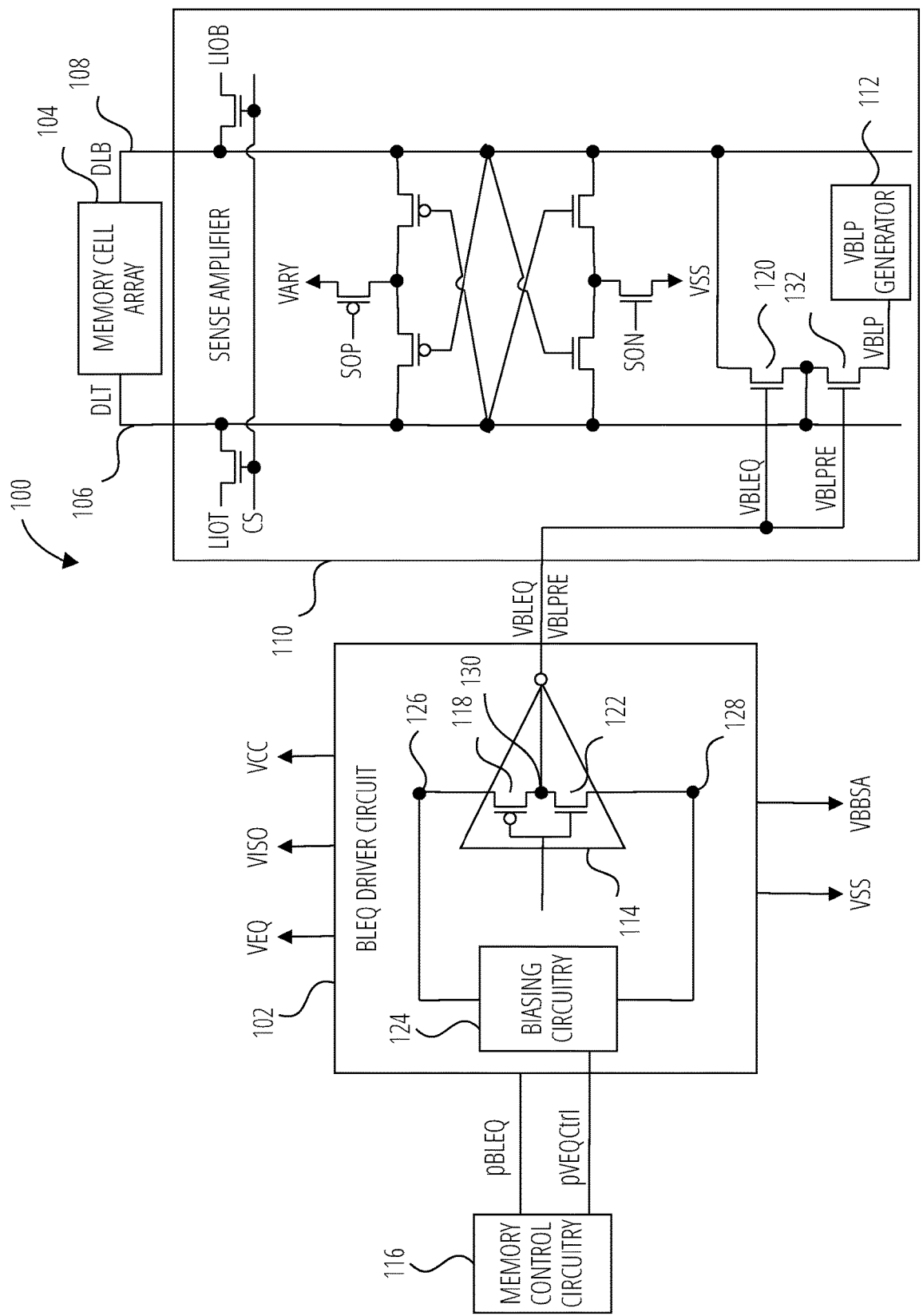
FIG. 1 is a circuit schematic illustration of a memory device, according to some embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein, the term "electrically connected" refers to both direct (i.e., no intervening electrical elements electrically connected in between) and indirect (i.e., one or more intervening elements electrically connected in between) electrical connections.

As used herein, the terms "active material" or "diffusion material" refer to a semiconductor material that has been doped to function as a channel material in a metal oxide semiconductor (MOS) field effect transistor (FET) (MOSFET). A MOSFET transistor having a channel material that has been doped predominantly with donor impurities is referred to herein as an N-type MOS (NMOS) transistor because the active material serving as the channel material for the NMOS transistor includes N-type semiconductor material. Similarly, a MOSFET transistor having a channel material that has been doped predominantly with trivalent or acceptor impurities is referred to herein as a P-type MOS (PMOS) transistor because the active material serving as the channel material for the PMOS transistor includes P-type semiconductor material.

As used herein, the term "diode connected transistor" refers to a MOSFET transistor having its gate terminal electrically connected to its drain terminal.

As used herein, the term "assert," when used with reference to an assertion of a voltage potential or other electrical signal on a gate terminal of a transistor, refers to an application of an appropriate voltage potential to "turn on" the transistor, or in other words cause the transistor to operate in a saturation state wherein a source terminal and a drain terminal of the transistor are electrically connected to each other through the transistor. By extension, the term "de-assert," when used with reference to a de-assertion of a voltage potential or other electrical signal on the gate terminal of the transistor, refers to an application of an appropriate voltage potential to "turn off" the transistor, or in other words cause the transistor to operate in a cutoff state wherein the source terminal and the drain terminal of the transistor are electrically isolated from each other through the transistor.

A market demand for continually faster operational speeds of memory devices has driven development of memory devices that pre-charge bit lines electrically connected to memory cells in memory cell arrays before performing a read operation. During a read operation, if a bit line is pre-charged to a voltage potential level that is substantially halfway between extremes of logic level voltage potentials, the swing time of the bit line voltage potential to an appropriate logic level is limited to the time to transition through substantially half a voltage potential range between the extremes of the logic levels.

In some instances it may be desirable to pre-charge two bit lines to substantially the same voltage potential at substantially the same time. A transistor may be electrically coupled between the two bit lines, and a gate terminal of the transistor may be asserted during a pre-charge operation. As a result, the voltage potentials of the bit lines may be equalized during the pre-charge operation.

A period of time from an assertion of a bit line equalization (BLED) voltage potential on a gate terminal to equalization of voltage potentials on the bit lines to within ten millivolts (10 mV) is referred to herein as a pre-charge period of time, or "tRP." Given the market demand for continually faster operational speeds, it is desirable to minimize the pre-charge period of time.

Another market demand in addition to that for faster operational speeds of memory devices is a market demand for increasingly smaller-sized memory devices (e.g., smaller chip area or "real estate," without limitation). Sometimes these market demands may be in opposition to each other. For example, chip size efficiency may be increased by increasing a number of memory cells electrically connected to a bit line, which would result in increased lengths of bit lines to accommodate the larger number of memory cells. Increasing the lengths of the bit lines, however, increases parasitic impedances (e.g., electrical resistance and capacitance, without limitation) of the bit lines, which in turn would increase the pre-charge period of time (since the pre-charge period of time is proportional to the product of the resistance and the capacitance of the bit lines).

One way to decrease the pre-charge period of time is to increase the conductivity of the BLEQ transistor electrically connecting the bit lines together, which would reduce the electrical resistance between the bit lines. An increase in the conductivity of the BLEQ transistor may serve to enable the use of longer bit lines, or merely provide for shorter pre-charge periods of time. One way to increase the conductivity of the BLEQ transistor is to increase the strength of the asserted voltage potential at the gate terminal of the BLEQ transistor. By way of non-limiting examples, for an NMOS BLEQ transistor the conductivity may be increased by increasing the voltage potential of the assertion on the gate terminal, and for a PMOS BLEQ transistor the conductivity may be increased by decreasing the voltage potential of the assertion on the gate terminal.

Driving circuitry used to assert a BLEQ voltage potential on the gate terminal of the BLEQ transistor, however, may be implemented using short gate length and/or thin-oxide transistors because of the market demand for smaller-sized devices. Short gate length and thin oxide transistors may, however, be susceptible to degradation if voltage potentials across the transistors are greater than degradation voltage potentials for the transistors. By way of non-limiting example, a transistor having a gate length of substantially fifty nanometers (nm) or less may be considered a "short" gate length transistor. Also by way of non-limiting example, a transistor having a thin oxide may have an oxide thickness of substantially twenty-five angstroms or less. As used herein, the term "degradation voltage potential," when used with reference to a transistor, is a voltage potential difference between a source terminal and a drain terminal below which the transistor is configured to operate without degrading the transistor, and above which prolonged exposure is expected to degrade the transistor. By way of non-limiting example, if a given transistor used to drive the BLEQ voltage potential has a 1.28 volt (V) degradation voltage potential, the transistor may be susceptible to degradation responsive to prolonged exposures of greater than 1.28 V between the source terminal and the drain terminal of the transistor. Accordingly, increasing the BLEQ voltage potential, which may be driven by one or more short gate length and/or thin-oxide driving transistors, may cause voltage potentials in excess of the degradation voltage potential across one or more driving transistors, which may compromise durability, longevity, and proper operation of the memory device. The use of larger driving transistors that are durable to increased voltage potentials would be contrary to the market demand for small-sized devices.

Disclosed herein are apparatuses, methods, and computing systems related to BLEQ driver circuitry that manipulates bias voltage potentials provided to driving transistors (e.g., pull-up and pull-down transistors) to enable higher BLEQ voltage potential assertions without increasing driving transistor size and without prolonged exposure of the driving transistors to voltage potentials exceeding a degradation voltage potential. As a result, pre-charge periods of time may be decreased as compared to those associated with lower BLEQ voltage potential assertions without compromising driving transistor size and without degrading driving transistors.

In some embodiments, an apparatus includes a pull-up node, a pull-down node, an output node, a low power supply node, an output inverter, and biasing circuitry. The output inverter includes a pull-up transistor and a pull-down transistor electrically connected in series between the pull-up node and the pull-down node. The output node is electrically connected between the pull-up transistor and the pull-down transistor. The pull-down transistor has a degradation voltage potential across the pull-down transistor below which the pull-down transistor is configured to operate to avoid degradation of the pull-down transistor. The biasing circuitry is configured to control voltage potentials at the pull-up node and the pull-down node to enable the output inverter to assert, at the output node, an output voltage potential that is greater than the degradation voltage potential higher than a low power supply voltage potential at the low power supply node.

In some embodiments an apparatus includes a pair of bit lines, a sense amplifier, and a BLEQ driver circuit. The pair of bit lines is electrically connected to a memory cell array. The sense amplifier includes a BLEQ transistor electrically connected across the pair of bit lines. The BLEQ driver circuit is configured to drive a BLEQ voltage potential of a gate terminal of the BLEQ transistor to electrically connect the pair of bit lines to each other via the BLEQ transistor during a pre-charge operation to pre-charge the pair of bit lines. The BLEQ transistor includes an output inverter and biasing circuitry. The output inverter includes a pull-down transistor electrically connected between an output terminal of the output inverter and a pull-down node 128 of the output inverter. The output terminal is electrically connected to the gate terminal of the BLEQ transistor. The pull-down transistor has a degradation voltage potential across the pull-down transistor below which the pull-down transistor is configured to operate to avoid degradation of the pull-down transistor. The biasing circuitry is configured to bias the output inverter to enable the output inverter to drive the gate terminal of the BLEQ transistor with a bit line equalization voltage potential that is greater than the degradation voltage potential higher than a low power supply voltage potential of the BLEQ driver circuit.

In some embodiments a method of driving a gate terminal of a BLEQ transistor includes triggering a pre-charge operation of a sense amplifier and applying an isolation voltage potential to a source terminal of a pull-up transistor responsive to the triggering. The isolation voltage potential is more than a degradation voltage potential greater than a low power supply voltage potential. The method also includes applying a bias voltage potential to a source terminal of a pull-down transistor responsive to the triggering. A drain terminal of the pull-up transistor is electrically connected to a drain terminal of the pull-down transistor at an output node. The pull-down transistor is configured to operate below the degradation voltage potential across the pull-down transistor to avoid degradation of the pull-down transistor. The method further includes driving, with the pull-up transistor, the isolation voltage potential to the output node responsive to the triggering, and electrically connecting, with the bit line equalization transistor, a first bit line to a second bit line responsive to the driving of the isolation voltage potential to the output node.

FIG. 1 is a circuit schematic illustration of a memory device 100, according to some embodiments. The memory device 100 includes a memory cell array 104, a first bit line 106 (DLT), a second bit line 108 (DLB), a sense amplifier 110, a BLEQ driver circuit 102, and memory control circuitry 116. The first bit line 106 and the second bit line 108 are electrically connected to the memory cell array 104 and the sense amplifier 110. The sense amplifier 110 includes a BLEQ transistor 120 electrically connected between the first bit line 106 and the second bit line 108. The BLEQ driver circuit 102 is configured to drive a BLEQ voltage potential VBLEQ of a gate terminal of the BLEQ transistor 120 to electrically connect the first bit line 106 to the second bit line 108 via the BLEQ transistor 120 during a pre-charge operation to equalize the first bit line 106 and the second bit line 108.

The sense amplifier 110 also includes bit line pre-charge voltage (VBLP) generator 112 and a bit line pre-charge transistor 132 configured to selectively electrically connect the VBLP generator 112 to at least one of the first bit line 106 and the second bit line 108. The VBLP generator 112 is configured to generate a bit line pre-charge voltage potential VBLP for pre-charging the first bit line 106 and the second bit line 108. The BLEQ driver circuit 102 is also configured to drive a bit line pre-charge signal VBLPRE to a gate terminal of the bit line pre-charge transistor 132 to electrically connect one of the first bit line 106 and the second bit line 108 to the VBLP generator 112 via the bit line pre-charge transistor 132 during the pre-charge operation, which may provide bit line pre-charge voltage potential VBLP generated by the VBLP generator 112 to the first bit line 106 and the second bit line 108.

During a sense operation the sense amplifier 110 is configured to latch a bit of a memory cell (not shown) of the memory cell array 104. Electrical connection of the sense amplifier to a low power supply voltage potential VSS and a high power supply voltage potential VARY may be controlled responsive to an SOP signal and an SON signal. Also, electrical connection of the first bit line 106 and the second bit line to local input/output lines LIOT and LIOB may be controlled by a column select signal CS.

The memory control circuitry 116 is configured to control driving of the BLEQ transistor 120 and the bit line pre-charge transistor 132 by the BLEQ driver circuit 102 using a pre-charge BLEQ control signal VBLEQ and a bit line pre-charge signal VBLPRE, respectively. In some embodiments the pre-charge BLEQ control signal VBLEQ and the bit line pre-charge signal VBLPRE may be the same signal (e.g., transistors 120 and 132 may conduct during the same period of time). The memory control circuitry 116 is configured to control the biasing circuitry 124 to bias the output inverter 114 using a pre-charge equalization control signal pVEQCtrl.

The BLEQ driver circuit 102 includes an output inverter 114 including a pull-down transistor 122 electrically connected between an output node 130 of the output inverter 114 and a pull-down node 128. The output node 130 is electrically connected to the gate terminal of the BLEQ transistor 120 (and to the bit line pre-charge transistor 132). The pull-down transistor 122 has a degradation voltage potential (e.g., 1.28 V) across the pull-down transistor 122 below which the pull-down transistor 122 is configured to operate to avoid degradation of the pull-down transistor 122. The BLEQ driver circuit 102 also includes a pull-up transistor 118 electrically connected between a pull-up node 126 and the output node 130.

The biasing circuitry 124 is configured to bias the output inverter 114 to enable the output inverter 114 to drive the gate terminal of the BLEQ transistor 120 with a bit line equalization voltage potential VBLEQ that is greater than the degradation voltage potential higher than a low power supply voltage potential VSS of the BLEQ driver circuit 102.

Figure 7:
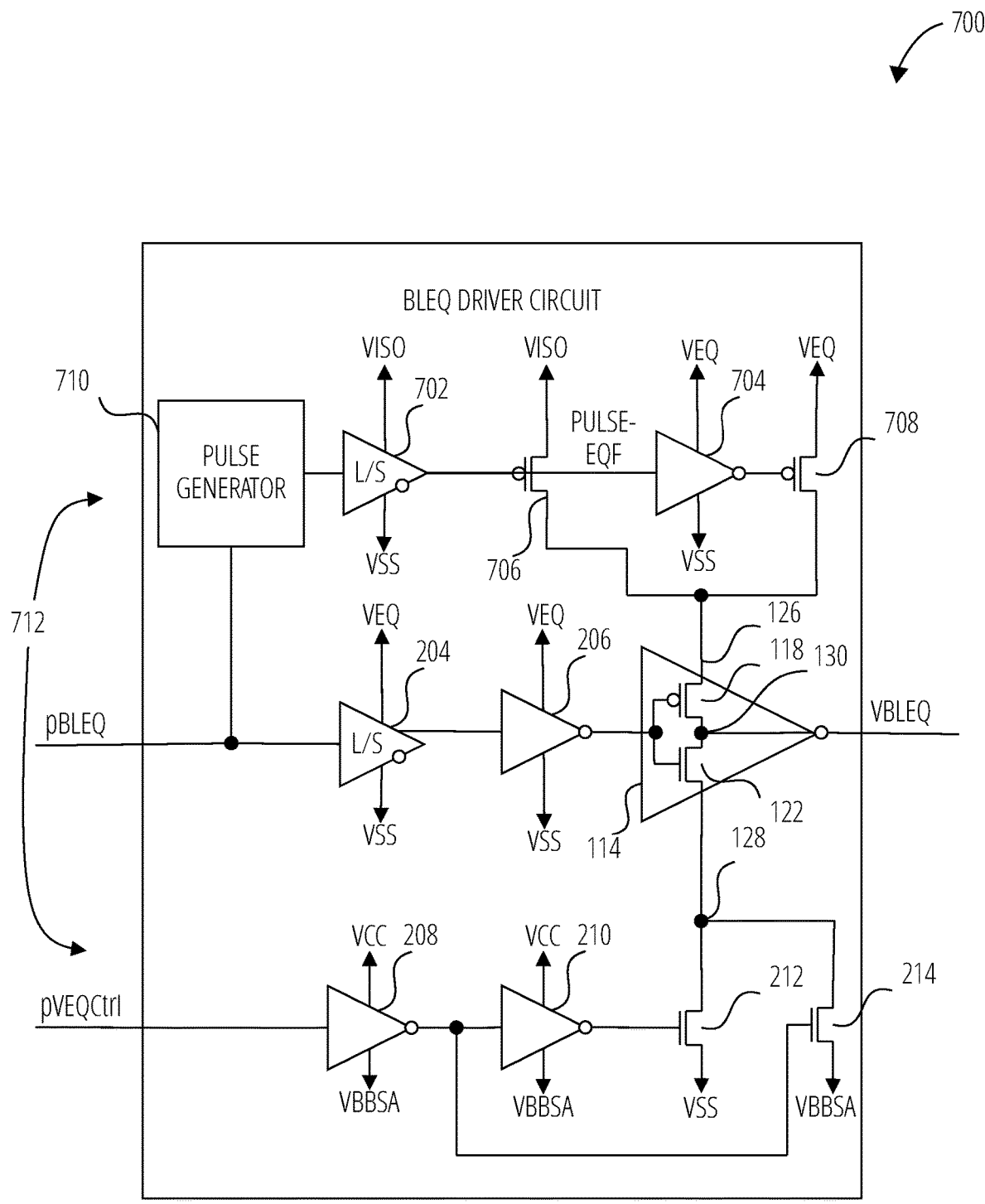
FIG. 7 is a circuit schematic illustration of another BLEQ driver circuit that may be used for the BLEQ driver circuit of the memory device of FIG. 1, according to some embodiments.
Figure 8:
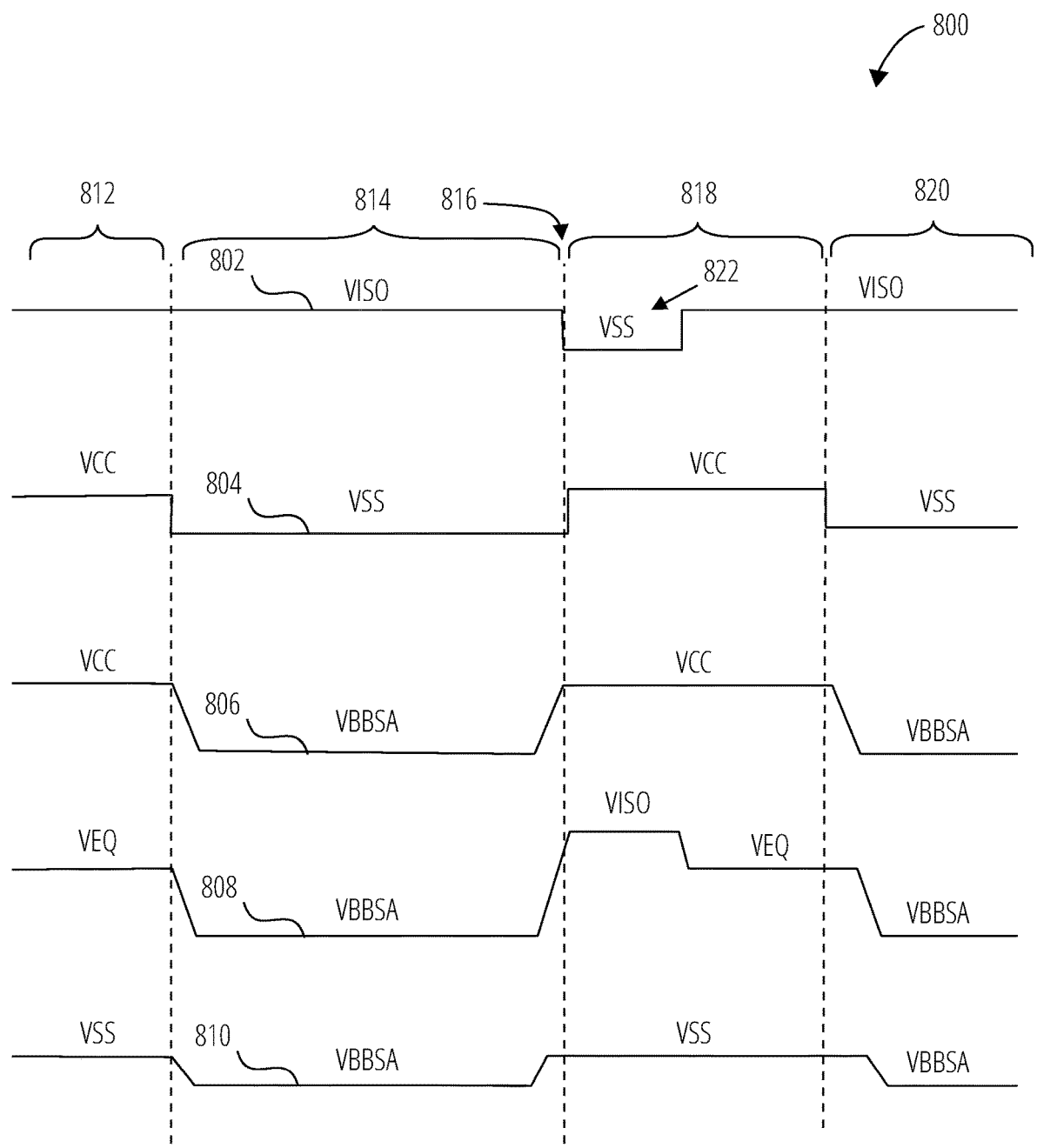
FIG. 8 is a signal timing diagram of signals of the BLEQ driver circuit of FIG. 7, according to some embodiments.

In some embodiments, an example of which is discussed in more detail with respect to FIG. 7 and FIG. 8, the biasing circuitry 124 is configured to, responsive to a transition to a pre-charge operation, apply the low power supply voltage potential VSS to the pull-down node 128 and apply an isolation voltage potential VISO to the pull-up node 126 for a predetermined amount of time, after which the biasing circuitry 124 is configured to apply a equalization voltage potential VEQ to the pull-up node 126. The isolation voltage potential VISO (e.g., 1.68 V) is more than the degradation voltage potential greater (e.g., 0.4 V greater) than the low power supply voltage potential VSS (e.g., 0 V). The equalization voltage potential VEQ, however, is less than or equal to the degradation voltage potential greater than the low power supply voltage potential VSS.

During the predetermined period of time the pull-up transistor 118 is in a conductive state, and the BLEQ voltage potential VBLEQ is at substantially the isolation voltage potential. Accordingly, a voltage potential across the pull-down transistor 122 is greater than the degradation voltage potential. Although the voltage potential across the pull-down transistor 122 during the predetermined period of time is greater than the degradation voltage potential, the pull-down transistor 122 is only exposed to this excessive voltage potential during the predetermined period of time. The inventors of this disclosure have observed that brief exposure of the pull-down transistor 122 to voltage potentials in excess of the degradation voltage potential is not sufficient to degrade the pull-down transistor 122. As a result, a length of the predetermined period of time may be selected to prevent degradation to the pull-down transistor 122 while increasing a conductivity of the BLEQ transistor 120 during the predetermined period of time.

Figure 2:
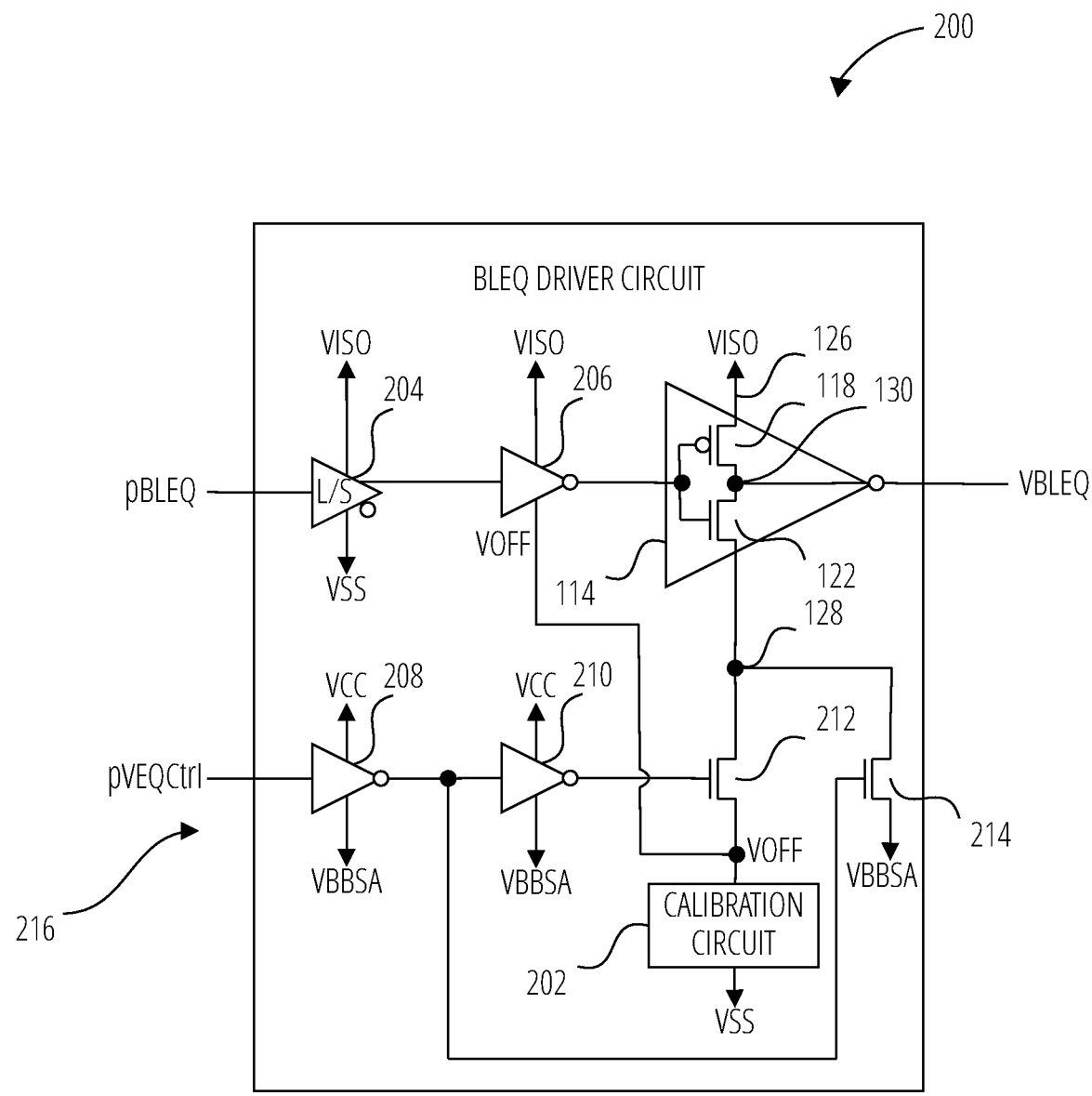
FIG. 2 is a circuit schematic illustration of a bit line equalization (BLEQ) driver circuit that may be used for a BLEQ driver circuit of the memory device of FIG. 1, according to some embodiments.
Figure 3:
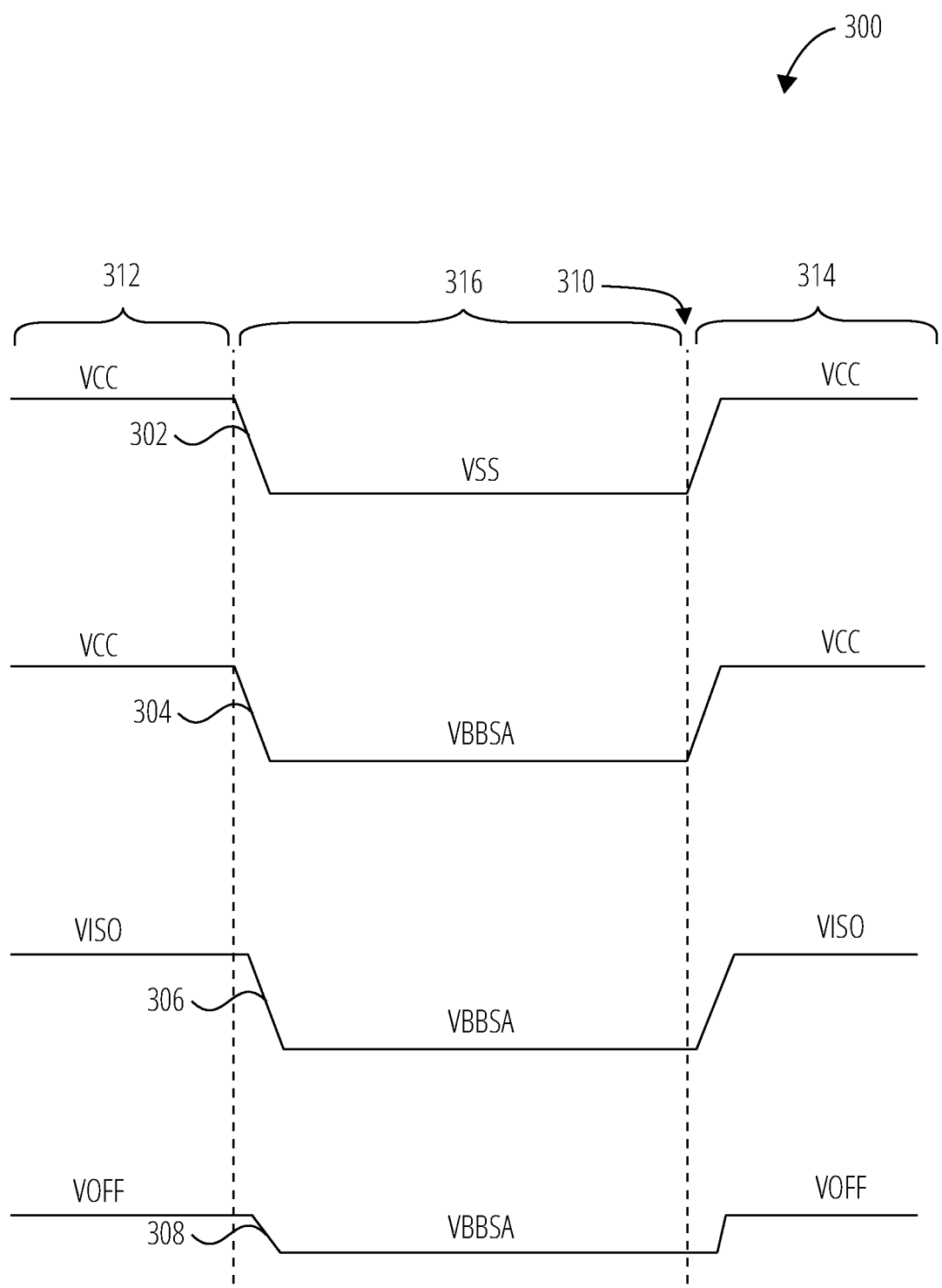
FIG. 3 is a signal timing diagram of signals of the BLEQ driver circuit of FIG. 2, according to some embodiments.

In some embodiments, an example of which is discussed in more detail with respect to FIG. 2 and FIG. 3, the biasing circuitry 124 is configured to, responsive to a transition to the pre-charge operation, apply an off voltage potential VOFF (not shown) to the pull-down node 128 and apply the isolation voltage potential VISO to the pull-up node 126. The off voltage potential VOFF is greater than the low power supply voltage potential and, as previously discussed, the isolation voltage potential VISO is more than the degradation voltage potential greater than the low power supply voltage potential VSS. The isolation voltage potential is, however, less than or equal to the degradation voltage potential greater than the low power supply voltage potential VSS. Since the voltage potential across the pull-down transistor 122 while the BLEQ voltage potential VBLEQ is asserted is less than or equal to the degradation voltage potential (i.e., substantially the isolation voltage potential VISO minus the off voltage potential VOFF), the conductivity of the BLEQ transistor 120 may be increased without exposing the pull-down transistor 122 to voltage potentials in excess of the degradation voltage potential.

In operation, at a triggering of a pre-charge operation the memory control circuitry 116 manipulates the pre-charge BLEQ control signal pBLEQ and the pre-charge equalization control signal pVEQCtrl to cause the output inverter 114 to assert the BLEQ voltage potential VBLEQ at the gate terminal of the BLEQ transistor 120. In response to the assertion of the BLEQ voltage potential, the BLEQ transistor 120 electrically connects the first bit line 106 to the second bit line 108. The VBLP generator 112 provides a pre-charge voltage potential VBLP to the first bit line 106 and the second bit line 108. The first bit line 106 and the second bit line 108 pre-charge to the pre-charge voltage potential VBLP.

FIG. 2 is a circuit schematic illustration of a BLEQ driver circuit 200 that may be used for the BLEQ driver circuit 102 of the memory device 100 of FIG. 1, according to some embodiments. The BLEQ driver circuit 200 includes the output inverter 114 of the BLEQ driver circuit 102, the pull-down node 128, and the pull-up node 126 of FIG. 1. As previously discussed, the output inverter 114 includes an output node 130, a pull-up transistor 118 and a pull-down transistor 122 electrically connected in series between the pull-up node 126 and the pull-down node 128 with the output node 130 electrically connected between the pull-up transistor 118 and the pull-down transistor 122. As also previously discussed, the pull-down transistor 122 has a degradation voltage potential across the pull-down transistor 122 below which the pull-down transistor 122 is configured to operate to avoid degradation of the pull-down transistor 122.

The BLEQ driver circuit 200 also includes biasing circuitry 216, which is an example of the biasing circuitry 124 of FIG. 1. The biasing circuitry 124 includes a bias control inverter 208, a bias drive inverter 210, a calibration circuit 202, a low power supply transistor 212, and a sense amplifier low power transistor 214. The biasing circuitry 216 is configured to control voltage potentials at the pull-up node 126 and the pull-down node 128 to enable the output inverter 114 to assert, at the output node 130, a BLEQ voltage potential VBLEQ that is greater than the degradation voltage potential higher than a low power supply voltage potential VSS at the low power supply node. More specifically, the BLEQ driver circuit 200 is configured to provide, to the pull-up node 126, an isolation voltage potential VISO that is greater than the degradation voltage potential higher than the low power supply voltage potential VSS. Also, the calibration circuit 202 is configured to provide, through the low power supply transistor 212 to the pull-down node 128, an off voltage potential VOFF that is less than or equal to the degradation voltage potential lower than the isolation voltage potential VISO. As a result, while the output inverter 114 is asserting the BLEQ voltage potential VBLEQ to a level that is higher than the degradation voltage potential greater than the low power voltage potential VSS, the voltage potential across the pull-down transistor 122 is less than or equal to the degradation voltage potential. More detail regarding examples of the calibration circuit 202 is discussed with reference to FIG. 4, FIG. 5, and FIG. 6.

The biasing circuitry 216 is configured to selectively apply the off voltage potential VOFF and a sense amplifier low power voltage potential VBBSA to the pull-down node 128. The low power supply transistor 212 is electrically connected between the pull-down node 128 and the calibration circuit 202, and the sense amplifier low power transistor 214 is electrically connected between the pull-down node 128 and a sense amplifier low power voltage potential node configured to receive a sense amplifier low power voltage potential VBBSA. The bias drive inverter 210 is electrically connected between a gate terminal of the sense amplifier low power transistor 214 and a gate terminal of the low power supply transistor 212. As a result, when the gate terminal of the sense amplifier low power transistor 214 is a asserted, causing the low power supply transistor 212 to conduct the off voltage potential VOFF to the pull-down node 128, a gate terminal of the low power supply transistor 212 is de-asserted, electrically isolating the off voltage potential VOFF from the pull-down node 128. Also, when the gate terminal of the sense amplifier low power transistor 214 is de-asserted, electrically isolating the sense amplifier low power voltage potential VBBSA from the pull-down node 128, the gate terminal of the low power supply transistor 212 is asserted, conducting the off voltage potential VOFF to the pull-down node 128. In this way only one of the off voltage potential VOFF and the sense amplifier low power voltage potential is applied to the pull-down node 128 at a time.

The bias control inverter 208 is configured to receive the pre-charge equalization control signal pVEQCtrl from memory control circuitry 116 (FIG. 1), invert the pre-charge equalization control signal pVEQCtrl, and deliver the inverted pre-charge equalization control signal pVEQCtrl to the gate terminal of the sense amplifier low power transistor 214 and to the bias drive inverter 210. Accordingly, assuming that the low power supply transistor 212 is an NMOS transistor, the pre-charge equalization control signal pVEQCtrl should be set at a logic level high to electrically connect the off voltage potential to the pull-down node 128. Also, the pre-charge equalization control signal pVEQCtrl should be set at a logic level low to electrically connect the sense amplifier low power voltage potential VBBSA to the pull-down node 128.

The BLEQ driver circuit 200 further includes a control driver 204 and a control inverter 206. The control driver 204 is configured to receive the pre-charge BLEQ control signal pBLEQ from the memory control circuitry 116 (FIG. 1), and drive the pre-charge BLEQ control signal pBLEQ to the control inverter 206. The control inverter 206 is configured to invert the driven pre-charge BLEQ control signal pBLEQ and provide the inverted pre-charge BLEQ control signal pBLEQ to the output inverter 114. As a result, in order to assert the BLEQ voltage potential VBLEQ the pre-charge BLEQ control signal pBLEQ should be asserted.

The isolation voltage potential VISO may also be provided to the control driver 204 and the control inverter 206 to power the control driver 204 and the control inverter 206. The low power supply voltage potential may be provided to the control driver 204 to power the control driver 204. Since the control inverter 206 may include a pull-down transistor (not shown) similar to the pull-down transistor 122 of the output inverter 114, the off voltage potential VOFF may also be provided to the control inverter 206. Also, since the control inverter 206 is powered by the isolation voltage potential VISO and the off voltage potential VOFF, a voltage potential across the pull-down transistor of the control inverter 206 may be less than or equal to the degradation voltage potential when an output of the control inverter 206 is asserted.

The bias control inverter 208 and the bias drive inverter 210 may be powered by a high power voltage potential VCC and the sense amplifier low power voltage potential VBBSA.

FIG. 3 is a signal timing diagram of signals 300 of the BLEQ driver circuit 200 of FIG. 2, according to some embodiments. The signals 300 include a pBLEQ signal 302 (corresponding to the pre-charge BLEQ control signal pBLEQ of FIG. 2), a pVEQCtrl signal 304 (corresponding to the pre-charge equalization control signal pVEQCtrl of FIG. 2), a VBLEQ signal 306 (corresponding to the BLEQ voltage potential VBLEQ of FIG. 2), and a pull-down node signal 308 (corresponding to a voltage potential of the pull-down node 128 of FIG. 2). FIG. 3 also illustrates a first pre-charge period of time 312, a sense period of time 316, a second pre-charge period of time 314, and a trigger event 310 (e.g., an assertion of the pBLEQ signal 302) at the end of the sense period of time 316 to trigger a transition from the sense period of time 316 to the second pre-charge period of time 314.

Referring to FIG. 2 and FIG. 3 together, in operation, during the first pre-charge period of time 312 the first bit line 106 and the second bit line 108 may be pre-charged. The VBLEQ signal 306 is asserted to cause the BLEQ transistor 120 (FIG. 1) to conduct, electrically connecting the first bit line 106 (FIG. 1) to the second bit line 108 (FIG. 1). Accordingly, the pBLEQ signal 302 and the pVEQctrl signal 304 are asserted. Voltage potentials of the pBLEQ signal 302 and the pVEQCtrl signal 304 during the first pre-charge period of time 312 may be substantially the high power voltage potential VCC.

With the pVEQCtrl signal 304 asserted the gate terminal of the sense amplifier low power transistor 214 is de-asserted, electrically isolating the pull-down node 128 from the sense amplifier low power voltage potential VBBSA. Also, the gate terminal of the low power supply transistor 212 is asserted, electrically connecting the pull-down node 128 to the off voltage potential VOFF provided by the calibration circuit 202. As a result, the pull-down node signal 308 is substantially the off voltage potential VOFF during the first pre-charge period of time 312. Furthermore, with the pBLEQ signal 302 asserted the VBLEQ signal 306 is provided to the output node 130 of the output inverter 114. As a result, a voltage potential across the pull-down transistor 122 is VBLEQ−VOFF, which is less than or equal to the degradation voltage potential of the pull-down transistor 122. By way of non-limiting example, VEQ may be substantially 1.68 V, VOFF may be substantially 0.4 V, and the degradation voltage potential of the pull-down transistor 122 may be substantially 1.28 V.

The sense period of time 316 may follow the first pre-charge period of time 312, as illustrated in FIG. 3. During the sense period of time 316 the pBLEQ signal 302 and the pVEQCtrl signal 304 may be de-asserted. In the embodiment of FIG. 2 and FIG. 3 the pBLEQ signal 302 and the pVEQCtrl signal 304 may transition to the low power voltage potential VSS and the sense amplifier low power voltage potential VBBSA, respectively. As a result, the gate terminal of the sense amplifier low power transistor 214 is asserted, electrically connecting the pull-down node 128 to the sense amplifier low power transistor 214. Also, the gate terminal of the low power supply transistor 212 is de-asserted, electrically isolating the pull-down node 128 from the off voltage potential. Accordingly, the pull-down node signal 308 may transition to the sense amplifier low power voltage potential VBBSA during the sense period of time 316.

With the pBLEQ signal 302 de-asserted during the sense period of time 316, the VBLEQ signal 306 may be de-asserted to a logic level low voltage potential (e.g., substantially VBBSA). Accordingly, the gate terminal of the BLEQ transistor 120 (FIG. 1) may be de-asserted, and the BLEQ transistor 120 may electrically isolate the first bit line 106 from the second bit line 108.

Responsive to a trigger event 310 triggering a transition to a second pre-charge period of time 314, the pBLEQ signal 302, the pVEQCtrl signal 304, the VBLEQ signal 306, and the pull-down node signal 308 may transition to the same levels as those discussed above for the first pre-charge period of time 312. Accordingly, the gate terminal of the BLEQ transistor 120 (FIG. 1) may be asserted by the VBLEQ signal 306 at substantially the isolation voltage potential VISO, which may strongly assert the gate terminal of the BLEQ transistor 120 and cause the BLEQ transistor 120 to electrically connect the first bit line 106 (FIG. 1) to the second bit line 108 (FIG. 1). In the second pre-charge period of time 314, similar to the first pre-charge period of time 312, the voltage potential across the pull-up transistor 118 may not exceed the degradation voltage potential despite strongly driving the gate of the BLEQ transistor 120 at the isolation voltage potential VISO.

Figure 4:
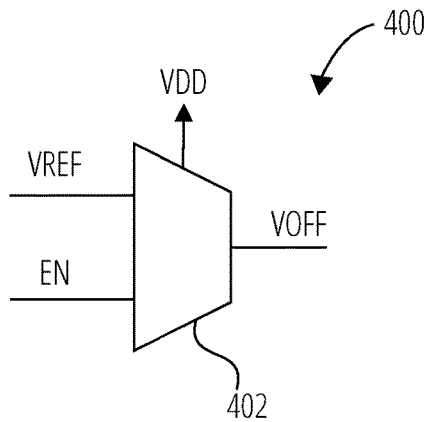
FIG. 4 is a circuit schematic illustration of a calibration circuit, which is one example of a calibration circuit of FIG. 2.

FIG. 4 is a circuit schematic illustration of a calibration circuit 400, which is one example of a calibration circuit 202 of FIG. 2. The calibration circuit 400 includes a voltage regulator circuit 402 configured to provide the off voltage potential VOFF. Inputs of the voltage regulator circuit 402 may include a reference voltage potential VREF and an EN signal. The voltage regulator circuit 402 may be powered by a power voltage potential VDD (e.g., 1 V). The voltage regulator circuit 402 may be configured to control a voltage level of the off voltage potential VOFF responsive to the reference voltage potential VREF and/or the EN signal. By way of non-limiting example, the off voltage potential VOFF provided by the voltage regulator circuit 402 may be substantially about 0.4 V.

Figure 5:
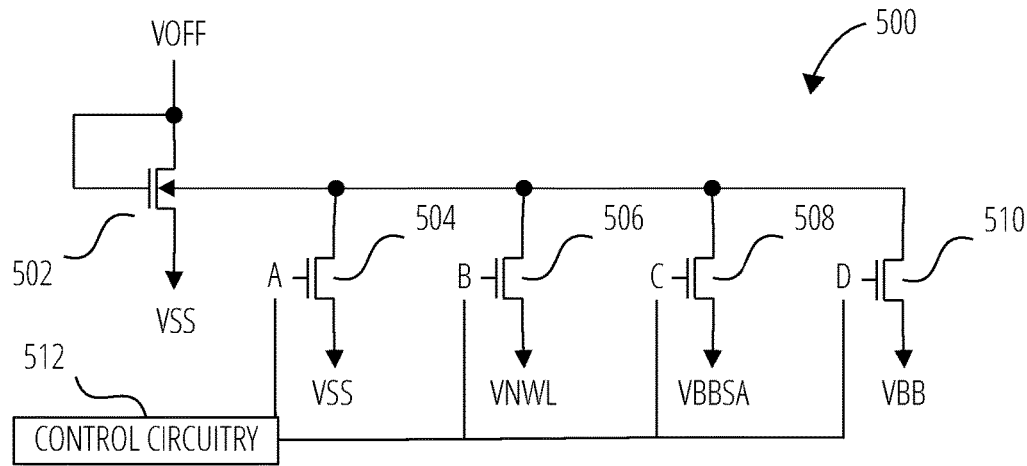
FIG. 5 is a circuit schematic illustration of a calibration circuit, which is another example of the calibration circuit of FIG. 2.

FIG. 5 is a circuit schematic illustration of a calibration circuit 500, which is another example of the calibration circuit 202 of FIG. 2. The calibration circuit 500 includes a diode connected transistor 502 including a body terminal. A source terminal of the diode connected transistor 502 is electrically connected to a low power supply node configured to receive a low power voltage potential VSS. A drain terminal of the diode connected transistor 502 is configured to provide the off voltage potential VOFF to the pull-down node 128 (FIG. 2).

The calibration circuit 500 also includes bias nodes configured to receive different bias voltage potentials (VSS, VNWL, VBBSA, and VBB, without limitation). The calibration circuit 500 further includes a transistors (first transistor 504, second transistor 506, third transistor 508, and fourth transistor 510, without limitation) electrically connected between the bias nodes and the body terminal of the diode connected transistor.

The calibration circuit 500 also includes control circuitry 512 electrically connected to gate nodes of the transistors. The control circuitry is configured to selectively assert a control signal on one of the gate nodes (e.g., one of signals A, B, C, or D) to selectively apply one of the bias voltage potentials (e.g., VSS, VNWL, VBBSA, or VBB) to the body terminal of the diode connected transistor 502.

The calibration circuit 500 is configured to leverage the body effect to change a threshold voltage potential of the diode connected transistor 502 depending on which of the different bias voltage potentials is electrically connected to the body terminal. Since the diode connected transistor 502 is diode connected, the threshold voltage potential, which is a gate to source voltage potential, is also a drain to source voltage potential of the diode connected transistor 502.

Accordingly, as the threshold voltage potential change responsive to changes in the bias voltage potential that is applied to the body terminal of the diode connected transistor 502, the drain to source voltage potential across the diode connected transistor 502 also changes. As a result, the control circuitry 512 may adjust the off voltage potential VOFF at the drain terminal of the diode connected transistor 502 by selectively asserting one of the signals A, B, C, or D. By way of non-limiting example, an assertion of one of signals A, B, C, or D may cause the off voltage potential VOFF to be substantially 0.4 V.

Figure 6:
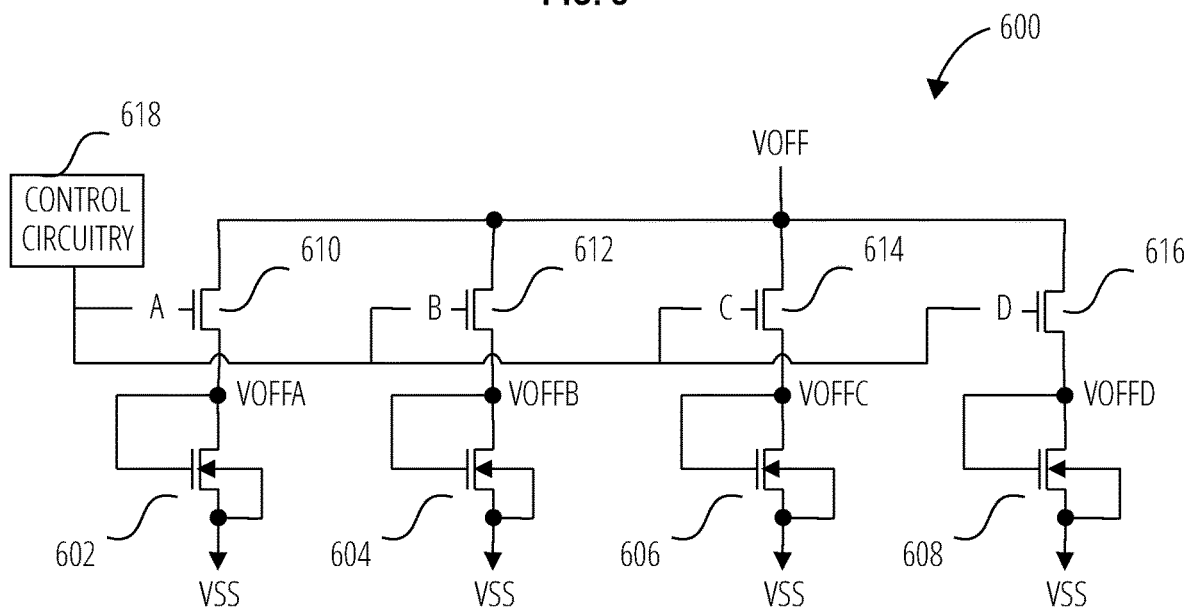
FIG. 6 is a circuit schematic illustration of a calibration circuit, which is yet another example of the calibration circuit of FIG. 2.

FIG. 6 is a circuit schematic illustration of a calibration circuit 600, which is yet another example of the calibration circuit 202 of FIG. 2. The calibration circuit 600 includes diode connected transistors (diode connected transistor 602, diode connected transistor 604, diode connected transistor 606, diode connected transistor 608, without limitation). Source terminals and body terminals of the diode connected transistors are electrically connected to the low power supply node, which is configured to receive the low power supply voltage potential VSS. Each of the diode connected transistors has a different width-to-length ratio to generate different bias voltage potentials (e.g., VOFFA, VOFFB, VOFFC, and VOFFD, without limitation) at drain terminals of the diode connected transistors. By way of non-limiting example, each of the diode connected transistors may have substantially the same width, but different lengths. In some embodiments diode connected transistor 602 may have a length L, diode connected transistor 604 may have a length 2×L (where "×" is the multiplication operator), diode connected transistor 606 may have a length 3×L, and diode connected transistor 608 may have a length 4×L.

The calibration circuit 600 also includes transistors (e.g., first transistor 610, second transistor 612, third transistor 614, and fourth transistor 616). Each of these transistors is electrically connected to a drain terminal of a different one of the diode connected transistors. The calibration circuit 600 further includes control circuitry 618 electrically connected to gate nodes of the transistors. The control circuitry configured to selectively assert a control signal (e.g., control signals A, B, C, and D, without limitation) on one of the gate nodes to selectively provide one of the different bias voltage potentials VOFFA, VOFFB, VOFFC, and VOFFD to the pull-down node 128 (FIG. 2) as the off voltage potential VOFF. As a result, the control circuitry 618 may adjust the off voltage potential VOFF by selectively asserting one of the signals A, B, C, or D. By way of non-limiting example, an assertion of one of signals A, B, C, or D may cause the off voltage potential VOFF to be substantially 0.4 V.

Any one of the calibration circuit 400 of FIG. 4, the calibration circuit 500 of FIG. 5, and the calibration circuit 600 of FIG. 6 may be used as the calibration circuit 202 of the BLEQ driver circuit 200 of FIG. 2 to provide the off voltage potential VOFF. The increase of the off voltage potential VOFF above the low power voltage potential VSS enables an increase of the driving voltage potential provided by the output inverter 114 of FIG. 2 of the isolation voltage potential VISO, which is greater than the degradation voltage potential of the pull-down transistor 122, above the low power voltage potential VSS. It is noted that the calibration circuit 400 of FIG. 4 may have a relatively high cost associated therewith to implement the voltage regulator circuit 402. It is also noted that the calibration circuit 500 and the calibration circuit 600 may have a relatively high level of complexity associated therewith at least because of the respective control circuitry 512 and control circuitry 618. FIG. 7 illustrates another implementation of the BLEQ driver circuit 102 of FIG. 2 that has less cost as compared to the calibration circuit 400 of FIG. 4 and less complexity as compared to the calibration circuit 500 and the calibration circuit 600 of FIG. 5 and FIG. 6, respectively.

FIG. 7 is a circuit schematic illustration of another BLEQ driver circuit 700 that may be used for the BLEQ driver circuit 102 of the memory device 100 of FIG. 1, according to some embodiments. Rather than provide an off voltage potential VOFF (FIG. 2) that is higher than the low power supply voltage potential VSS to the pull-down node 128 while asserting the BLEQ voltage potential VBLEQ as discussed above with respect to the BLEQ driver circuit 200 of FIG. 2, the BLEQ driver circuit 700 of FIG. 7 applies a voltage potential across the pull-down transistor 122 during an assertion of the BLEQ voltage potential VBLEQ that is greater than the degradation voltage potential for a short period of time. After the short period of time the BLEQ driver circuit 700 reduces the voltage potential across the pull-down transistor 122 to less than or equal to degradation voltage potential.

Similar to the BLEQ driver circuit 200 of FIG. 2, the BLEQ driver circuit 700 includes a control driver 204, a control inverter 206, and an output inverter 114. As previously discussed, the control driver 204 is configured to receive the pre-charge BLEQ control signal pBLEQ from the memory control circuitry 116 (FIG. 1) and drive the pre-charge BLEQ control signal pBLEQ to provide the driven pre-charge BLEQ control signal pBLEQ to the control inverter 206. Also, the control inverter 206 is configured to invert the driven pre-charge BLEQ control signal pBLEQ signal to generate an inverted pre-charge BLEQ control signal pBLEQ and provide the inverted pre-charge BLEQ control signal pBLEQ to the output inverter 114. In contrast to the BLEQ driver circuit 200 of FIG. 2, the control driver 204 is powered by an equalization voltage potential VEQ and the low power supply voltage potential VSS. The equalization voltage potential VEQ is less than or equal to the degradation voltage potential higher than the low power supply voltage potential VSS. Also in contrast to the BLEQ driver circuit 200 of FIG. 2, the control inverter 206 is power by the equalization voltage potential VEQ and the low power supply voltage potential VSS.

The BLEQ driver circuit 700 also includes biasing circuitry 712, which may be used as the biasing circuitry 124 of FIG. 1. Similar to the biasing circuitry 216 of FIG. 2, the biasing circuitry 712 includes a bias control inverter 208, a bias drive inverter 210, a low power supply transistor 212, and a sense amplifier low power transistor 214. Similar to the low power supply transistor 212 of FIG. 2, the bias control inverter 208 is configured to receive the pre-charge equalization control signal pVEQCtrl from the memory control circuitry 116 (FIG. 1). Also similar to the low power supply transistor 212 of FIG. 2, the bias control inverter 208 and the bias drive inverter 210 are powered by the high power supply voltage potential VCC and the sense amplifier low power supply voltage potential VBBSA. In contrast to the BLEQ driver circuit 200 of FIG. 2, however, the drain terminal of the low power supply transistor 212 of the biasing circuitry 712 is electrically connected to the low power supply voltage potential node (VSS) rather than a calibration circuit configured to provide an off voltage potential VOFF (FIG. 2). In other words, the biasing circuitry 712 is configured to electrically connect the pull-down node 128 to the low power supply node during assertions of the BLEQ voltage potential VBLEQ. As a result, during an assertion of the BLEQ voltage potential VBLEQ the biasing circuitry 712 is configured to provide the low power voltage potential to the pull-down node 128. Similar to the low power supply transistor 212 of FIG. 2, however, during a sense operation during which the BLEQ voltage potential VBLEQ is de-asserted, the biasing circuitry 712 is configured to provide the sense amplifier low power voltage potential VBBSA to the pull-down node 128.

The biasing circuitry 712 also includes a first bias transistor (isolation voltage potential transistor 706) electrically connected between an isolation voltage potential node (VISO) and the pull-up node 126. The isolation voltage potential node is configured to receive the isolation voltage potential VISO, which is more than the degradation voltage potential greater than the low power supply voltage potential VSS. The biasing circuitry 712 further includes a second bias transistor (equalization voltage potential transistor 708) electrically connected between an equalization voltage potential node (VEQ) and the pull-up node 126. The equalization voltage potential node is configured to receive the equalization voltage potential VEQ, which is less than or equal to the degradation voltage potential greater than the low power supply voltage potential VSS.

The biasing circuitry 712 further includes a bias inverter (pulse inverter 704) electrically connected between a first gate of the first bias transistor (isolation voltage potential transistor 706) and a second gate of the second bias transistor (equalization voltage potential transistor 708). Accordingly, when the gate terminal of the isolation voltage potential transistor 706 is asserted the gate terminal of the equalization voltage potential transistor 708 is de-asserted. Likewise, when the gate terminal of the isolation voltage potential transistor 706 is de-asserted the gate terminal of the equalization voltage potential transistor 708 is asserted. As a result, only one of the isolation voltage potential transistor 706 and the equalization voltage potential transistor 708 is turned on at a time, and by extension only one of the isolation voltage potential VISO and the equalization voltage potential VEQ is applied to the pull-up node 126 at a time.

The biasing circuitry 712 includes a pulse generator 710 and a pulse driver 702 configured to provide a pulse, on a PULSE-EQF signal, to the pulse inverter 704 to electrically connect the isolation voltage potential node (VISO) to the pull-up node 126 during the pulse and to the equalization voltage potential VEQ otherwise. The pulse generator 710 is configured to generate the pulse responsive to a transition, by a sense amplifier (e.g., the sense amplifier 110 of FIG. 1), into a pre-charge operation. For example, in the embodiment of FIG. 7 the pulse generator 710 is configured to receive the pre-charge BLEQ control signal pBLEQ, and generate the pulse when the pre-charge BLEQ control signal pBLEQ asserts, which may be a trigger event for transitioning to a pre-charge operation.

As compared to the BLEQ driver circuit 200 of FIG. 2, the BLEQ driver circuit 700 would have less layout impact (e.g., chip area impact) because a voltage regulator and control circuitry is not used. The BLEQ driver circuit 700, however, strongly asserts, at least for a short period of time, the BLEQ voltage potential VBLEQ, which increases the conductivity of the BLEQ transistor 120 (FIG. 1), and in turn reduces the amount of time (tRP) to equalize the first bit line 106 (FIG. 1) with the second bit line 108 (FIG. 1).

FIG. 8 is a signal timing diagram of signals 800 of the BLEQ driver circuit 700 of FIG. 7, according to some embodiments. The signals 800 include a PULSE-EQF signal 802 (corresponding to the PULSE-EQF signal of FIG. 7), a pBLEQ signal 804 (corresponding to the pre-charge BLEQ control signal pBLEQ of FIG. 7), a pVEQCtrl signal 806 (corresponding to the pre-charge equalization control signal pVEQCtrl of FIG. 7), a VBLEQ signal 808 (corresponding to the BLEQ voltage potential VBLEQ of FIG. 7), and a pull-down node signal 810 (corresponding to a voltage potential on the pull-down node 128 of FIG. 7). The signals 800 are shown during a first pre-charge period of time 812, a first sense period of time 814, a second pre-charge period of time 818, and a second sense period of time 820.

Referring to FIG. 7 and FIG. 8 together, during the first pre-charge period of time 812 (e.g., an end of the first pre-charge period of time 812), the pVEQCtrl signal 806 is asserted at substantially VCC. As a result, a gate terminal of the low power supply transistor 212 is asserted and a gate terminal of the sense amplifier low power transistor 214 is de-asserted, conducting the low power supply voltage potential VSS to the pull-down node 128. As shown in FIG. 8, during the first pre-charge period of time 812 the pull-down node signal 810 is at the low power supply voltage potential VSS.

The pBLEQ signal 804 is also asserted during the first pre-charge period of time 812. In the segment of the first pre-charge period of time 812 shown, however, a pulse of the PULSE-EQF signal 802 has already passed. As a result, the PULSE-EQF signal 802 is at substantially the isolation voltage potential during the segment of the first pre-charge period of time 812 shown in FIG. 8. With the PULSE-EQF signal 802 at the isolation voltage potential VISO the gate terminal of the equalization voltage potential transistor 708 is asserted and the gate terminal of the isolation voltage potential transistor 706 is de-asserted, conducting the equalization voltage potential to the pull-up node 126. Accordingly, responsive to the pBLEQ signal 804 being asserted during the first pre-charge period of time 812, the VBLEQ signal 808 is also asserted to substantially the equalization voltage potential VEQ since the pull-up node 126 is substantially at the equalization voltage potential VEQ.

At a transition from the first pre-charge period of time 812 to the first sense period of time 814 the pVEQCtrl signal 806 is de-asserted to substantially the sense amplifier low power supply voltage potential VBBSA. Accordingly, the gate terminal of the sense amplifier low power transistor 214 is asserted and the gate terminal of the low power supply transistor 212 is de-asserted, conducting the sense amplifier low power supply voltage potential VBBSA to the pull-down node 128. Accordingly, the pull-down node signal 810 is substantially at the sense amplifier low power supply voltage potential VBBSA during the first sense period of time 814.

The pBLEQ signal 804 is also de-asserted to substantially the sense amplifier low power supply voltage potential VBBSA during the first sense period of time 814. The PULSE-EQF signal 802 remains asserted at substantially the isolation voltage potential VISO during the first sense period of time 814. Accordingly, the equalization voltage potential VEQ is conducted, via isolation voltage potential transistor 706, to the pull-up node 126. Responsive to the pBLEQ signal 804 being de-asserted during the first sense period of time 814, however, the VBLEQ signal 808 is also de-asserted to substantially the sense amplifier low power supply voltage potential VBBSA.

A trigger event 816 to trigger a transition from the first sense period of time 814 to the second pre-charge period of time 818 occurs. By way of non-limiting example, the pBLEQ signal 804 and the pVEQCtrl signal 806 may assert to substantially VCC as the trigger event 816, triggering a transition of the BLEQ driver circuit 700 to the second pre-charge period of time 818. Accordingly, the low power supply voltage potential VSS is conducted to the pull-down node 128, similarly as discussed with reference to the first pre-charge period of time 812. As a result, during the second pre-charge period of time 818 the pull-down node signal 810 is at the low power supply voltage potential VSS.

Responsive to the pBLEQ signal 804 asserting, the pulse generator 710 generates a pulse 822 (to substantially the low power supply voltage potential VSS) in the PULSE-EQF signal 802 during the first part of the second pre-charge period of time 818. Responsive to the pulse 822, the isolation voltage potential transistor 706 turns on and the equalization voltage potential transistor 708 turns off, conducting the isolation voltage potential to the pull-up node 126. As a result, during the pulse 822 the VBLEQ signal 808 is driven to substantially the isolation voltage potential VISO. After the pulse, but still during the second pre-charge period of time 818, however, the equalization voltage potential transistor 708 conducts the equalization voltage potential to the pull-up node 126. Accordingly, after the pulse 822, but still during the second pre-charge period of time 818, the VBLEQ signal 808 is driven to substantially the equalization voltage potential VEQ.

During the pulse 822, the voltage potential across the pull-down transistor 122 is substantially the isolation voltage potential VISO minus the low power supply voltage potential VSS (VISO−VSS), which is greater than the degradation voltage potential. Since the pulse 822 is held only for a relatively short period of time, however, the pull-down transistor 122 may not be degraded. For the rest of the second pre-charge period of time 818 the voltage potential across the pull-down transistor 122 is substantially the equalization voltage potential VEQ minus the low power supply voltage potential VSS (VEQ-VSS), which is less than or equal to the degradation voltage potential. Following the second pre-charge period of time the signals 800 transition to similar values as those discussed for the first sense period of time 814 during the second sense period of time 820.

Figure 9:
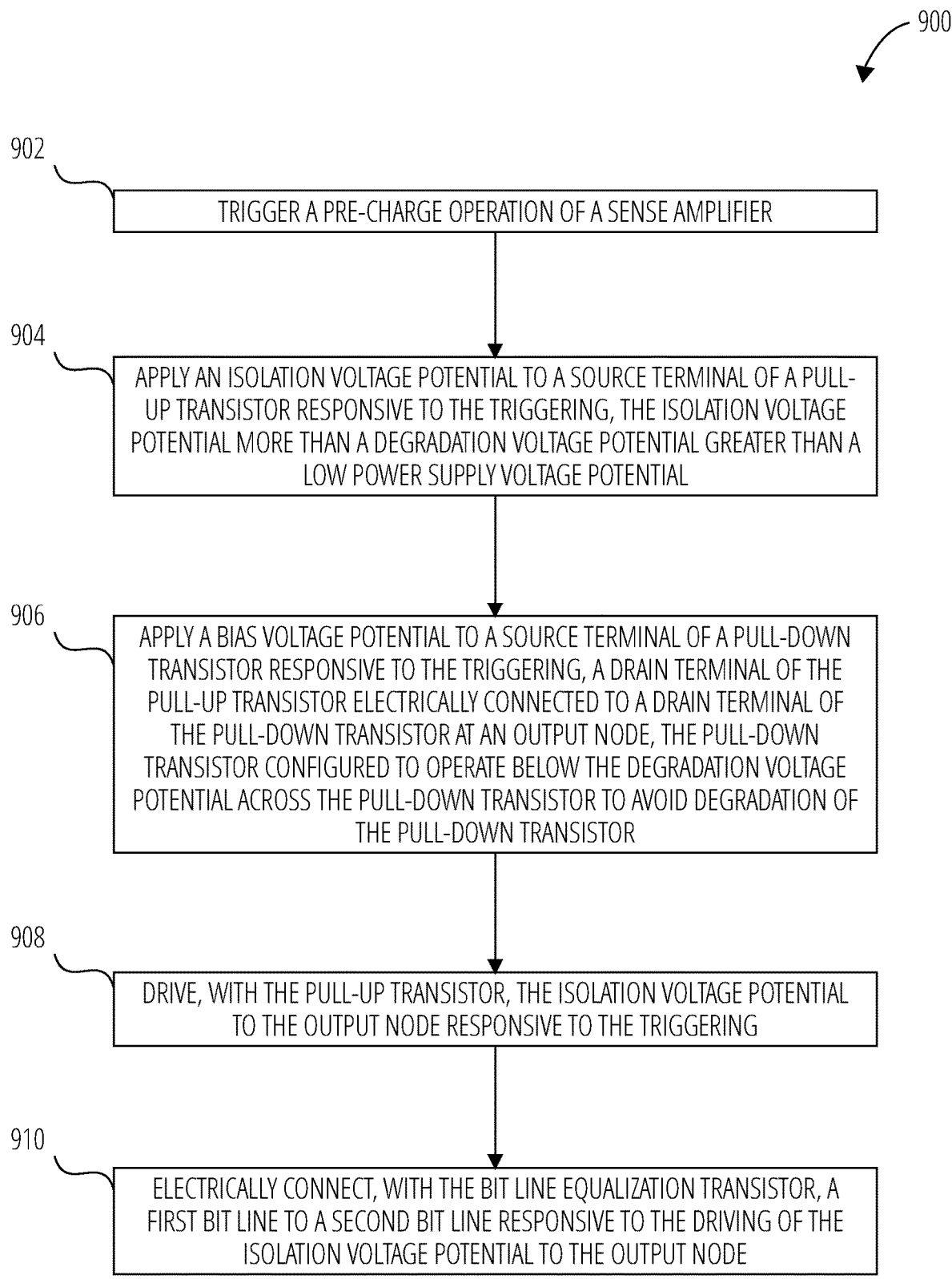
FIG. 9 is a flowchart illustrating a method of driving a gate terminal of a bit line equalization transistor, according to some embodiments.

FIG. 9 is a flowchart illustrating a method 900 of driving a gate terminal of a bit line equalization transistor, according to some embodiments. In operation 902, method 900 triggers a pre-charge operation of a sense amplifier. By way of non-limiting example, the trigger may be a trigger event (e.g., trigger event 310, trigger event 816) such as assertions of a pBLEQ signal (FIG. 1, FIG. 2, FIG. 7) (e.g., pBLEQ signal 302 of FIG. 3, pBLEQ signal 804 of FIG. 8) by memory control circuitry 116 (FIG. 1).

In operation 904, method 900 applies an isolation voltage potential (VISO) to a source terminal of a pull-up transistor (e.g., pull-up transistor 118 of FIG. 1, FIG. 2, FIG. 7) responsive to the triggering (operation 902). The isolation voltage potential VISO is more than a degradation voltage potential greater than a low power supply voltage potential VSS.

In operation 906, method 900 applies a bias voltage potential to a source terminal of a pull-down transistor (e.g., pull-down transistor 122 of FIG. 1, FIG. 2, FIG. 7) responsive to the triggering (operation 902). A drain terminal of the pull-up transistor is electrically connected to a drain terminal of the pull-down transistor at an output node (e.g., output node 130 of FIG. 1, FIG. 2, FIG. 7). The pull-down transistor is configured to operate below the degradation voltage potential across the pull-down transistor to avoid degradation of the pull-down transistor. In some embodiments applying the bias voltage potential to the source terminal of the pull-down transistor includes applying an off voltage potential VOFF to the source terminal of the pull-up transistor, wherein the off voltage potential VOFF is less than or equal to the degradation voltage potential less than the isolation voltage potential VISO.

In operation 908, method 900 drives, with the pull-up transistor, the isolation voltage potential VISO to the output node responsive to the triggering (operation 902). In some embodiments driving the isolation voltage potential VISO to the output node includes asserting a gate terminal of the pull-up transistor and de-asserting the gate terminal of the pull-down transistor. In some embodiments driving the isolation voltage potential VISO to the output node includes applying an equalization voltage potential to the source terminal of the pull-up transistor a predetermined period of time following the applying of the isolation voltage potential to the source terminal of the pull-up transistor, wherein the equalization voltage potential is less than or equal to the degradation voltage potential greater than the low power voltage potential, and wherein applying the bias voltage potential to the source terminal of the pull-down transistor comprises applying the low power voltage potential to the source terminal of the pull-up transistor.

In operation 910, method 900 electrically connects, with the bit line equalization transistor, a first bit line (e.g., first bit line 106 of FIG. 1) to a second bit line (e.g., second bit line 108 of FIG. 1) responsive to the driving of the isolation voltage potential to the output node (operation 908).

Figure 10:
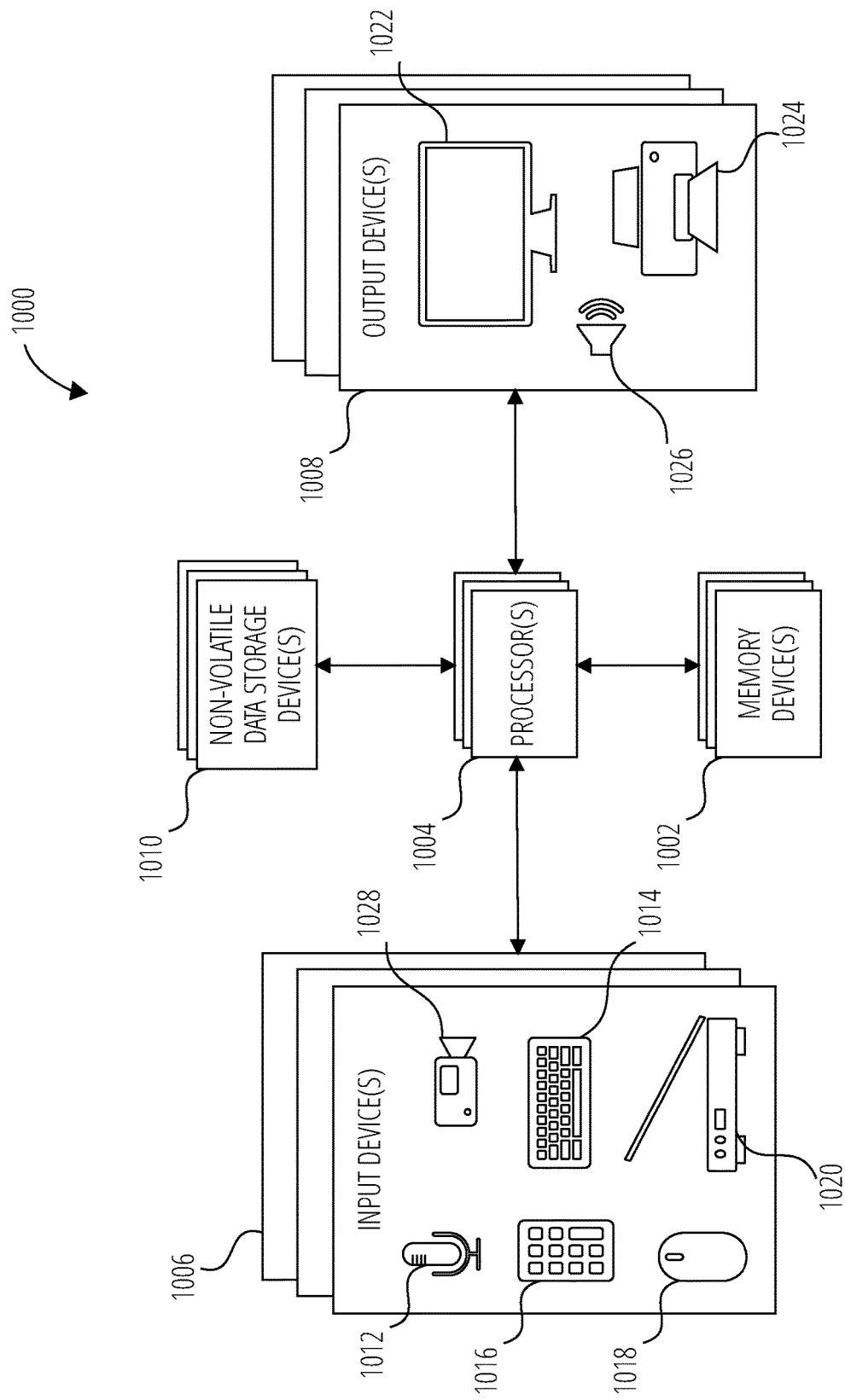
FIG. 10 is a block diagram of a computing system, according to some embodiments.

FIG. 10 is a block diagram of a computing system 1000, according to some embodiments. The computing system 1000 includes one or more processors 1004 operably coupled to one or more memory devices 1002, one or more non-volatile data storage devices 1010, one or more input devices 1006, and one or more output devices 1008. In some embodiments the computing system 1000 includes a personal computer (PC) such as a desktop computer, a laptop computer, a tablet computer, a mobile computer (e.g., a smartphone, a personal digital assistant (PDA), etc.), a network server, or other computer device.

In some embodiments the one or more processors 1004 may include a central processing unit (CPU) or other processor configured to control the computing system 1000. In some embodiments the one or more memory devices 1002 include random access memory (RAM), such as volatile data storage (e.g., dynamic RAM (DRAM) static RAM (SRAM), etc.). In some embodiments the one or more non-volatile data storage devices 1010 include a hard drive, a solid state drive, Flash memory, erasable programmable read only memory (EPROM), other non-volatile data storage devices, or any combination thereof. In some embodiments the one or more input devices 1006 include a keyboard 1014, a pointing device 1018 (e.g., a mouse, a track pad, etc.), a microphone 1012, a keypad 1016, a scanner 1020, a camera 1028, other input devices, or any combination thereof. In some embodiments the output devices 1008 include an electronic display 1022, a speaker 1026, a printer 1024, other output devices, or any combination thereof.

Figure 11:
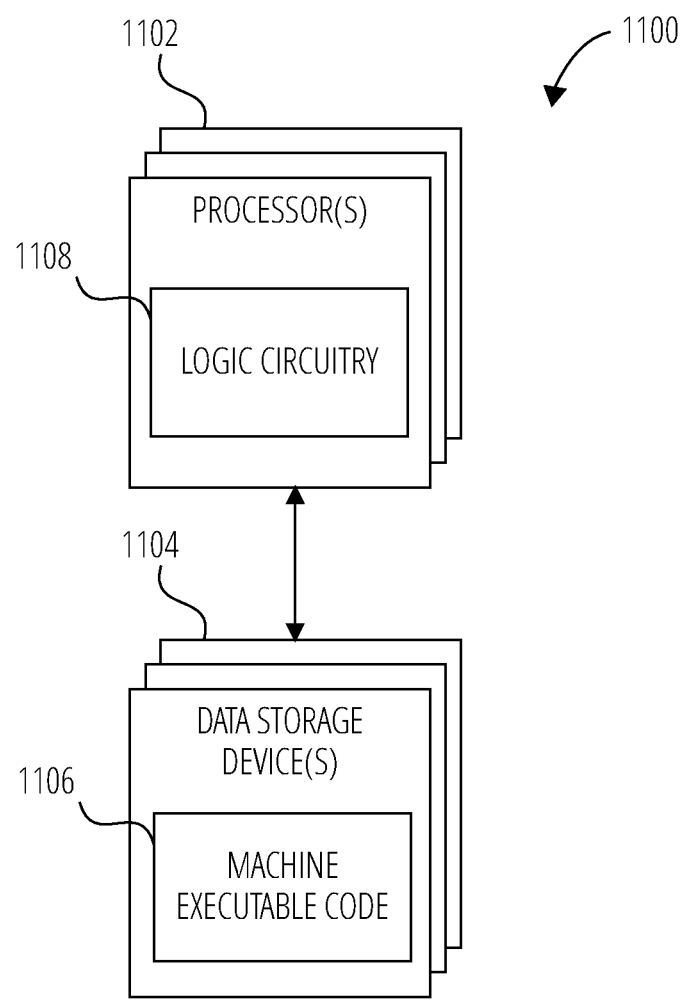
FIG. 11 is a block diagram of circuitry that, in some embodiments, may be used to implement various functions, operations, acts, processes, and/or methods disclosed herein.

It will be appreciated by those of ordinary skill in the art that functional elements of embodiments disclosed herein (e.g., functions, operations, acts, processes, and/or methods) may be implemented in any suitable hardware, software, firmware, or combinations thereof. FIG. 11 illustrates non-limiting examples of implementations of functional elements disclosed herein. In some embodiments, some or all portions of the functional elements disclosed herein may be performed by hardware specially configured for carrying out the functional elements.

FIG. 11 is a block diagram of circuitry 1100 that, in some embodiments, may be used to implement various functions, operations, acts, processes, and/or methods disclosed herein.

The circuitry 1100 includes one or more processors 1102 (sometimes referred to herein as "processors 1102") operably coupled to one or more data storage devices (sometimes referred to herein as "storage 1104"). The storage 1104 includes machine executable code 1106 stored thereon and the processors 1102 include logic circuitry 1108. The machine executable code 1106 includes information describing functional elements that may be implemented by (e.g., performed by) the logic circuitry 1108. The logic circuitry 1108 is adapted to implement (e.g., perform) the functional elements described by the machine executable code 1106. The circuitry 1100, when executing the functional elements described by the machine executable code 1106, should be considered as special purpose hardware configured for carrying out functional elements disclosed herein. In some embodiments the processors 1102 may be configured to perform the functional elements described by the machine executable code 1106 sequentially, concurrently (e.g., on one or more different hardware platforms), or in one or more parallel process streams.

When implemented by logic circuitry 1108 of the processors 1102, the machine executable code 1106 is configured to adapt the processors 1102 to perform operations of embodiments disclosed herein. For example, the machine executable code 1106 may be configured to adapt the processors 1102 to perform at least a portion or a totality of the method 900 of FIG. 9 (e.g., operation 902, triggering a pre-charge operation of a sense amplifier). As another example, the machine executable code 1106 may be configured to adapt the processors 1102 to perform at least a portion or a totality of the operations discussed for the memory control circuitry 116 of FIG. 1, the calibration circuit 202 of FIG. 2, the control circuitry 512 of FIG. 5, the control circuitry 618 of FIG. 6, and/or the pulse generator 710 of FIG. 7.

The processors 1102 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer is configured to execute functional elements corresponding to the machine executable code 1106 (e.g., software code, firmware code, hardware descriptions) related to embodiments of the present disclosure. It is noted that a general-purpose processor (may also be referred to herein as a host processor or simply a host) may be a microprocessor, but in the alternative, the processors 1102 may include any conventional processor, controller, microcontroller, or state machine. The processors 1102 may also be implemented as a combination of computing devices, such as a combination of a DSP and a microprocessor, a plurality of microprocessors, one or more microprocessors in conjunction with a DSP core, or any other such configuration.

In some embodiments the storage 1104 includes volatile data storage (e.g., random-access memory (RAM)), non-volatile data storage (e.g., Flash memory, a hard disc drive, a solid state drive, erasable programmable read-only memory (EPROM), etc.). In some embodiments the processors 1102 and the storage 1104 may be implemented into a single device (e.g., a semiconductor device product, a system on chip (SOC), etc.). In some embodiments the processors 1102 and the storage 1104 may be implemented into separate devices.

In some embodiments the machine executable code 1106 may include computer-readable instructions (e.g., software code, firmware code). By way of non-limiting example, the computer-readable instructions may be stored by the storage 1104, accessed directly by the processors 1102, and executed by the processors 1102 using at least the logic circuitry 1108. Also by way of non-limiting example, the computer-readable instructions may be stored on the storage 1104, transferred to a memory device (not shown) for execution, and executed by the processors 1102 using at least the logic circuitry 1108. Accordingly, in some embodiments the logic circuitry 1108 includes electrically configurable logic circuitry 1108.

In some embodiments the machine executable code 1106 may describe hardware (e.g., circuitry) to be implemented in the logic circuitry 1108 to perform the functional elements. This hardware may be described at any of a variety of levels of abstraction, from low-level transistor layouts to high-level description languages. At a high-level of abstraction, a hardware description language (HDL) such as an IEEE Standard hardware description language (HDL) may be used. By way of non-limiting examples, VERILOG™, SYSTEMVERILOG™ or very large scale integration (VLSI) hardware description language (VHDL™) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of the logic circuitry 1108 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in some embodiments the machine executable code 1106 may include an HDL, an RTL, a GL description, a mask level description, other hardware description, or any combination thereof.

In embodiments where the machine executable code 1106 includes a hardware description (at any level of abstraction), a system (not shown, but including the storage 1104) may be configured to implement the hardware description described by the machine executable code 1106. By way of non-limiting example, the processors 1102 may include a programmable logic device (e.g., an FPGA or a PLC) and the logic circuitry 1108 may be electrically controlled to implement circuitry corresponding to the hardware description into the logic circuitry 1108. Also by way of non-limiting example, the logic circuitry 1108 may include hard-wired logic manufactured by a manufacturing system (not shown, but including the storage 1104) according to the hardware description of the machine executable code 1106.

Regardless of whether the machine executable code 1106 includes computer-readable instructions or a hardware description, the logic circuitry 1108 is adapted to perform the functional elements described by the machine executable code 1106 when implementing the functional elements of the machine executable code 1106. It is noted that although a hardware description may not directly describe functional elements, a hardware description indirectly describes functional elements that the hardware elements described by the hardware description are capable of performing.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. An apparatus, comprising:
   a pull-up node;
   a pull-down node;
   an output node;
   a low power supply node;
   an output inverter including a pull-up transistor and a pull-down transistor electrically connected in series between the pull-up node and the pull-down node, the output node electrically connected between the pull-up transistor and the pull-down transistor, the pull-down transistor having a degradation voltage potential across the pull-down transistor below which the pull-down transistor is configured to operate to avoid degradation of the pull-down transistor; and
   biasing circuitry configured to control voltage potentials at the pull-up node and the pull-down node to enable the output inverter to assert, at the output node, an output voltage potential that is greater than the degradation voltage potential higher than a low power supply voltage potential at the low power supply node.

2. The apparatus of claim 1, wherein:
   the biasing circuitry is configured to provide, to the pull-up node, an isolation voltage potential that is greater than the degradation voltage potential higher than the low power supply voltage potential; and
   the biasing circuitry includes a calibration circuit configured to provide, to the pull-down node, an off voltage potential that is less than or equal to the degradation voltage potential lower than the isolation voltage potential.

3. The apparatus of claim 2, wherein the calibration circuit is configured to provide the off voltage potential to the pull-down node through a low power supply transistor.

4. The apparatus of claim 2, wherein the calibration circuit includes a voltage regulator circuit configured to provide the off voltage potential.

5. The apparatus of claim 2, wherein the calibration circuit includes:
   a diode connected transistor including a body terminal, a source terminal of the diode connected transistor electrically connected to the low power supply node, a drain terminal of the diode connected transistor configured to provide the off voltage potential to the pull-down node;
   a plurality of bias nodes configured to electrically connect to a plurality of different bias voltage potentials;
   a plurality of transistors electrically connected between the plurality of bias nodes and the body terminal of the diode connected transistor; and control circuitry electrically connected to gate nodes of the plurality of transistors, the control circuitry configured to selectively assert a control signal on one of the gate nodes to selectively apply one of the plurality of different bias voltage potentials to the body terminal of the diode connected transistor.

6. The apparatus of claim 2, wherein the calibration circuit includes:
a plurality of diode connected transistors, source terminals and body terminals of the plurality of diode connected transistors electrically connected to the low power supply node, each of the plurality of diode connected transistors having a different width-to-length ratio to generate different bias voltage potentials at drain terminals of the plurality of diode connected transistors;
a plurality of transistors, each of the plurality of transistors electrically connected to a drain terminal of a different one of the plurality of diode connected transistors; and
control circuitry electrically connected to gate nodes of the plurality of transistors, the control circuitry configured to selectively assert a control signal on one of the gate nodes to selectively provide one of the different bias voltage potentials to the pull-down node as the off voltage potential.

7. The apparatus of claim 1, wherein:
the biasing circuitry is configured to electrically connect the pull-down node to the low power supply node; and
the biasing circuitry includes:
a first bias transistor electrically connected between an isolation voltage potential node and the pull-up node, the isolation voltage potential node configured to receive an isolation voltage potential that is more than the degradation voltage potential greater than the low power supply voltage potential; and
a second bias transistor electrically connected between an equalization voltage potential node and the pull-up node, the equalization voltage potential node configured to receive an equalization voltage potential that is less than or equal to the degradation voltage potential greater than the low power supply voltage potential.

8. The apparatus of claim 7, further comprising:
a bias inverter electrically connected between a first gate of the first bias transistor and a second gate of the second bias transistor; and
a pulse generator configured to provide a pulse to the bias inverter to electrically connect the isolation voltage potential node to the pull-up node during the pulse and to the equalization voltage potential otherwise.

9. The apparatus of claim 8, wherein the pulse generator is configured to generate a pulse responsive to a transition, by a sense amplifier, into a pre-charge operation.

10. The apparatus of claim 1, further comprising:
a memory cell array;
a first bit line and a second bit line electrically connected to the memory cell array; and
a sense amplifier including a bit line equalization transistor, the bit line equalization transistor electrically connected between the first bit line and the second bit line, a gate terminal of the bit line equalization transistor electrically connected to the output node of the output inverter.

11. An apparatus, comprising:
a pair of bit lines electrically connected to a memory cell array;
a sense amplifier including a bit line equalization (BLEQ) transistor electrically connected across the pair of bit lines; and
a BLEQ driver circuit configured to drive a BLEQ voltage potential of a gate terminal of the BLEQ transistor to electrically connect the pair of bit lines to each other via the BLEQ transistor during a pre-charge operation to pre-charge the pair of bit lines, the BLEQ driver circuit comprising:
an output inverter including a pull-down transistor electrically connected between an output node of the output inverter and a pull-down node of the output inverter, the output node electrically connected to the gate terminal of the BLEQ transistor, the pull-down transistor having a degradation voltage potential across the pull-down transistor below which the pull-down transistor is configured to operate to avoid degradation of the pull-down transistor; and
biasing circuitry configured to bias the output inverter to enable the output inverter to drive the gate terminal of the BLEQ transistor with a bit line equalization voltage potential that is greater than the degradation voltage potential higher than a low power supply voltage potential of the BLEQ driver circuit.

12. The apparatus of claim 11, wherein:
the output inverter further includes a pull-up transistor electrically connected between a pull-up node of the output inverter and the output node;
the biasing circuitry is configured to, responsive to a transition to the pre-charge operation:
apply the low power supply voltage potential to the pull-down node;
apply, for a predetermined period of time, an isolation voltage potential to the pull-up node, the isolation voltage potential more than the degradation voltage potential greater than the low power supply voltage potential; and
apply, after the predetermined period of time, an equalization voltage potential to the pull-up node, the equalization voltage potential less than or equal to the degradation voltage potential greater than the low power supply voltage potential.

13. The apparatus of claim 11, wherein the BLEQ driver circuit includes:
a low power supply transistor electrically connected between the pull-down node and a low power supply voltage potential node of the BLEQ driver, the low power supply voltage potential node configured to receive the low power supply voltage potential; and
a sense amplifier low power transistor electrically connected between a the pull-down node and a sense amplifier low power voltage potential node, the sense amplifier low power voltage potential node configured to receive a sense amplifier low power supply voltage potential.

14. The apparatus of claim 11, wherein:
the output inverter further includes a pull-up transistor electrically connected between a pull-up node of the output inverter and the output node;
the biasing circuitry is configured to, responsive to a transition to the pre-charge operation:
apply an off voltage potential to the pull-down node, the off voltage potential greater than the low power supply voltage potential; and
apply an isolation voltage potential to the pull-up node, the isolation voltage potential more than the degradation voltage potential greater than the low power supply voltage potential, the isolation voltage potential less than or equal to the degradation voltage potential less than the isolation voltage potential.

15. The apparatus of claim 14, wherein the biasing circuitry further comprises a calibration circuit configured to generate the off voltage potential.

16. A method of driving a gate terminal of a bit line equalization transistor, the method comprising:
   triggering a pre-charge operation of a sense amplifier;
   applying an isolation voltage potential to a source terminal of a pull-up transistor responsive to the triggering, the isolation voltage potential more than a degradation voltage potential greater than a low power supply voltage potential;
   applying a bias voltage potential to a source terminal of a pull-down transistor responsive to the triggering, a drain terminal of the pull-up transistor electrically connected to a drain terminal of the pull-down transistor at an output node, the pull-down transistor configured to operate below the degradation voltage potential across the pull-down transistor to avoid degradation of the pull-down transistor;
   driving, with the pull-up transistor, the isolation voltage potential to the output node responsive to the triggering; and
   electrically connecting, with the bit line equalization transistor, a first bit line to a second bit line responsive to the driving of the isolation voltage potential to the output node.

17. The method of claim 16, wherein driving the isolation voltage potential to the output node comprises:
   asserting a gate terminal of the pull-up transistor; and
   de-asserting a gate terminal of the pull-down transistor.

18. The method of claim 16, further comprising applying an equalization voltage potential to the source terminal of the pull-up transistor a predetermined period of time following the applying of the isolation voltage potential to the source terminal of the pull-up transistor, the equalization voltage potential less than or equal to the degradation voltage potential greater than the low power supply voltage potential, wherein applying the bias voltage potential to the source terminal of the pull-down transistor comprises applying the low power supply voltage potential to the source terminal of the pull-up transistor.

19. The method of claim 16, wherein applying the bias voltage potential to the source terminal of the pull-down transistor comprises applying an off voltage potential to the source terminal of the pull-up transistor, the off voltage potential less than or equal to the degradation voltage potential less than the isolation voltage potential.

20. A computing system, comprising:
   one or more processors; and
   a memory device electrically connected to the one or more processors, the memory device comprising:
      a memory cell array;
      a pair of bit lines electrically connected to the memory cell array;
      a sense amplifier including a bit line equalization (BLEQ) transistor electrically connected between the pair of bit lines; and
      a bit line equalization driver circuit including an output inverter configured to provide a BLEQ voltage potential to a gate terminal of the BLEQ transistor, an asserted voltage potential of the BLEQ voltage potential responsive to a trigger of a pre-charge operation to pre-charge the pair of bit lines greater than a degradation voltage potential across a pull-down transistor of the output inverter below which the pull-down transistor is configured to operate to avoid degradation of the pull-down transistor.

* * * * *

UNITED STATES PATENT AND TRADEMARK OFFICE
CERTIFICATE OF CORRECTION

PATENT NO. : 11,367,476 B2
APPLICATION NO. : 16/988970
DATED : June 21, 2022
INVENTOR(S) : Sang-Kyun Park and Yuan He Page 1 of 1

It is certified that error appears in the above-identified patent and that said Letters Patent is hereby corrected as shown below:

In the Specification
Column 4, Line 67, change "(BLED)" to --(BLEQ)--

Signed and Sealed this
Twenty-seventh Day of September, 2022

Katherine Kelly Vidal
*Director of the United States Patent and Trademark Office*